United States Patent
Gu et al.

(10) Patent No.: US 9,743,514 B2
(45) Date of Patent: Aug. 22, 2017

(54) MULTILAYER CERAMIC ELECTRONIC COMPONENT, METHOD OF MANUFACTURING THE SAME, AND CIRCUIT BOARD HAVING THE SAME

(71) Applicant: SAMSUNG ELECTRO-MECHANICS CO., LTD., Suwon-Si, Gyeonggi-Do (KR)

(72) Inventors: Hyun Hee Gu, Suwon-Si (KR); Myung Jun Park, Suwon-Si (KR); Hye Jin Jeong, Suwon-Si (KR); Byoung Jin Chun, Suwon-Si (KR); Young Sook Lee, Suwon-Si (KR); Hye Young Choi, Suwon-Si (KR); Chung Yeol Lee, Suwon-Si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 31 days.

(21) Appl. No.: 14/794,569

(22) Filed: Jul. 8, 2015

(65) Prior Publication Data
US 2016/0211074 A1   Jul. 21, 2016

(30) Foreign Application Priority Data

Jan. 20, 2015  (KR) .................. 10-2015-0009525

(51) Int. Cl.
*H05K 1/03* (2006.01)
*H05K 3/00* (2006.01)
(Continued)

(52) U.S. Cl.
CPC .......... *H05K 1/0306* (2013.01); *H01G 2/065* (2013.01); *H01G 4/012* (2013.01); *H01G 4/232* (2013.01);
(Continued)

(58) Field of Classification Search
CPC ........................ H05K 1/0036; H05K 3/0067
See application file for complete search history.

(56) References Cited

U.S. PATENT DOCUMENTS

| | | | | |
|---|---|---|---|---|
| 6,331,930 B1* | 12/2001 | Kuroda | ................. | H01G 4/012 361/303 |
| 8,988,856 B2* | 3/2015 | Oh | ........................ | H01G 4/008 361/301.4 |

(Continued)

FOREIGN PATENT DOCUMENTS

| JP | 2008-071926 A | 3/2008 |
|---|---|---|
| JP | 2008-181956 A | 8/2008 |

(Continued)

OTHER PUBLICATIONS

Korean Office Action dated May 12, 2016, issued in Korean patent application No. 10-2015-0009525. (w/ English translation).

*Primary Examiner* — Jeremy C Norris
(74) *Attorney, Agent, or Firm* — McDermott Will & Emery LLP

(57) ABSTRACT

A multilayer ceramic electronic component includes a ceramic body including dielectric layers and internal electrodes and having first and second surfaces opposing each other in a first direction, third and fourth surfaces opposing each other in a second direction, and fifth and sixth surfaces opposing each other in a third direction, base electrode layers disposed on the ceramic body and including main portions connected to the internal electrodes and extension portions extending from the main portions, and resin electrode layers disposed on the base electrode layers while leaving end portions of the extension portions exposed. A width of the extension portion is narrower than a width of the outer surface of the ceramic body on which the extension (Continued)

portion is disposed, measured in a direction parallel to a width direction of the extension portion.

41 Claims, 17 Drawing Sheets

(51) Int. Cl.
  *H01G 2/06* (2006.01)
  *H01G 4/012* (2006.01)
  *H01G 4/232* (2006.01)
  *H01G 4/12* (2006.01)
  *H01G 4/30* (2006.01)
  *H05K 1/18* (2006.01)
(52) U.S. Cl.
  CPC ............ *H05K 3/0067* (2013.01); *H01G 4/12* (2013.01); *H01G 4/30* (2013.01); *H05K 1/181* (2013.01); *H05K 2201/10015* (2013.01)

(56) References Cited

U.S. PATENT DOCUMENTS

2015/0022945 A1    1/2015   Park et al.
2015/0318111 A1*   11/2015   Lee .......................... H01G 4/12
                                                361/301.4

FOREIGN PATENT DOCUMENTS

| KR | 10-0586962 B1 | 6/2006 |
| KR | 10-1434108 B1 | 8/2014 |

* cited by examiner

MULTILAYER CERAMIC ELECTRONIC COMPONENT, METHOD OF MANUFACTURING THE SAME, AND CIRCUIT BOARD HAVING THE SAME

CROSS-REFERENCE TO RELATED APPLICATION

This application claims the priority and benefit of Korean Patent Application No. 10-2015-0009525 filed on Jan. 20, 2015, with the Korean Intellectual Property Office, the disclosure of which is incorporated herein by reference.

BACKGROUND

The present disclosure relates to a multilayer ceramic electronic component having a low equivalent series resistance as well as excellent reliability and durability, a method of manufacturing the same, and a circuit board having the same.

Electronic components using a ceramic material, such as capacitors, inductors, piezoelectric elements, varistors, thermistors, and the like, include a ceramic body formed of the ceramic material, internal electrodes formed in the ceramic body, and external electrodes mounted on surfaces of the ceramic body to be connected to the internal electrodes.

Among ceramic electronic components, a multilayer ceramic capacitor includes a plurality of stacked dielectric layers, internal electrodes disposed to face each other with respective dielectric layers interposed therebetween, and external electrodes electrically connected to the internal electrodes.

In addition, multilayer ceramic capacitors have been usefully used as bypass capacitors disposed in the power supply circuits of large-scale integration (LSI) schemes. In this role, multilayer ceramic capacitors should effectively remove high frequency noise in order to serve as bypass capacitors. Demand for multilayer ceramic capacitors for use as bypass capacitors has increased as electronic devices have been provided with high frequencies. Multilayer ceramic capacitors used as bypass capacitors may be electrically connected to mounting pads of circuit boards through solders, and the mounting pads may be connected to other external circuits by wiring patterns or conductive vias in the board.

Multilayer ceramic capacitors have equivalent series resistance (ESR) and equivalent series inductance (ESL) components in addition to capacitance components. These ESR and ESL components may hinder the use of multilayer ceramic capacitors as bypass capacitors.

Therefore, a need exists for developing multilayer ceramic capacitors having a low equivalent series resistance (ESR) values.

SUMMARY

An aspect of the present disclosure may provide a multilayer ceramic electronic component having low equivalent series resistance and excellent reliability and durability, a method of manufacturing the same, and a circuit board having the same.

According to an aspect of the present disclosure, a multilayer ceramic electronic component including a ceramic body including dielectric layers and internal electrodes, and external electrodes including base electrode layers and resin electrode layers disposed on the base electrode layers, a method of manufacturing the same, and a circuit board having the same may be provided.

The resin electrode layers may be disposed on the base electrode layers, but may partially expose the base electrode layers instead of covering the base electrode layers entirely, such that equivalent series resistance of the multilayer ceramic electronic component may be decreased.

In the base electrode layers, exposed regions of the base electrode layers, on which the resin electrode layers are not formed, may have a width narrower than a width of outer surfaces of the ceramic body on which the exposed regions of the base electrode layers are formed, such that the multilayer ceramic electronic component may have improved durability to bending force.

Portions of edges of the base electrode layers may be exposed in which the resin electrode layers are not formed, such that equivalent series resistance of the multilayer ceramic electronic component may be decreased, and remaining regions of the edges of the base electrode layers may be covered by the resin electrode layers, such that the multilayer ceramic electronic component may have improved moisture resistance, reliability, and durability to bending force.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
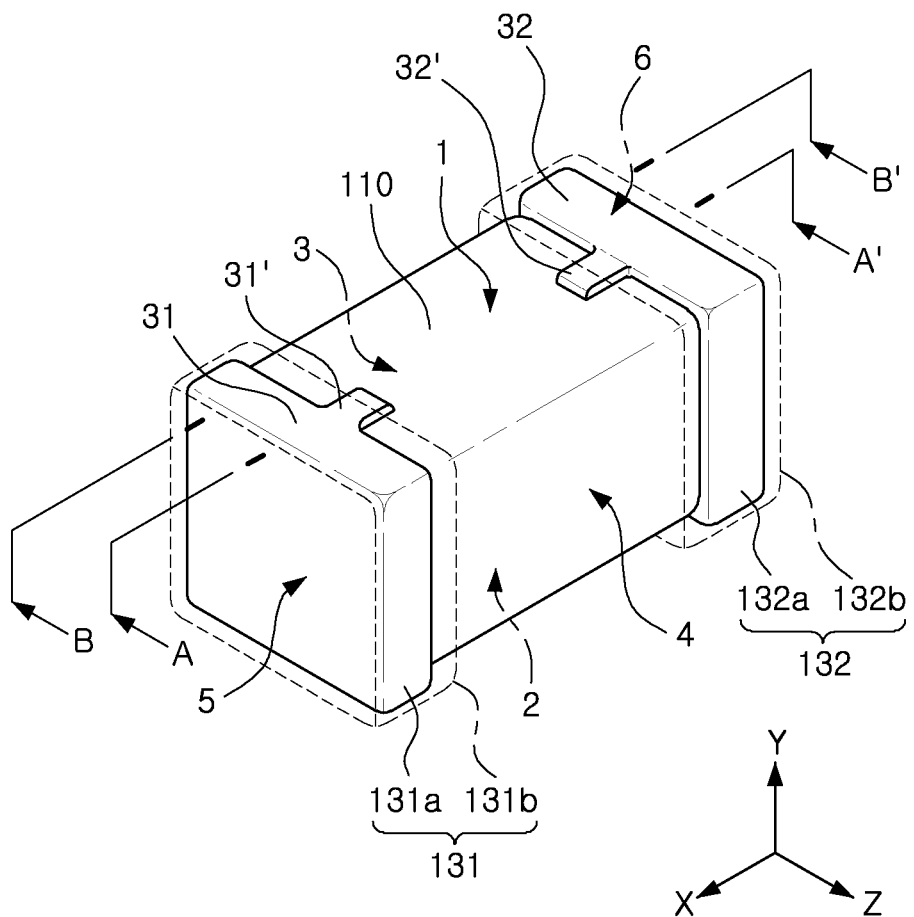
FIG. 1 is a perspective view illustrating a multilayer ceramic electronic component according to an exemplary embodiment of the present disclosure.

Hereinafter, embodiments of the present disclosure will be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Multilayer Ceramic Electronic Component

A multilayer ceramic electronic component according to an exemplary embodiment of the present disclosure may include a ceramic body and external electrodes.

The ceramic body includes dielectric layers and internal electrodes, and the external electrodes may include base electrode layers connected to the internal electrodes, and resin electrode layers disposed on the base electrode layers.

According to an exemplary embodiment of the present disclosure, the resin electrode layers are disposed on the base electrode layers, but may partially expose the base electrode layers instead of covering the base electrode layers entirely.

The resin electrode layers may be formed on the base electrode layers, so as to cover portions of edges of the base electrode layers, but not to be formed in the remaining portions of the edges of the base electrode layers.

Portions of the edges of the base electrode layers may be exposed in which the resin electrode layers are not formed, such that equivalent series resistance of the multilayer ceramic electronic component may be decreased, while remaining regions of the edges of the base electrode layers are covered by the resin electrode layers, such that moisture resistance and reliability of the multilayer ceramic electronic component, and durability thereof to bending force may be improved. The durability to a bending force refers to a degree to which the multilayer ceramic electronic component may endure the bending force applied thereto at the time of occurrence of a bending phenomenon therein without damages or cracks occurring therein (hereinafter, referred to as 'durability to bending force').

According to an exemplary embodiment of the present disclosure, the external electrodes may further include plating layers disposed on the resin electrode layers.

The plating layers may be disposed to be directly connected to the exposed regions of the base electrode layers on which the resin electrode layers are not formed.

The resin electrode layer may be disposed so that a first region of an edge of the base electrode layer may be exposed and a second region of the edge of the base electrode layer may be covered by the resin electrode layer.

The first region is not particularly limited, but the first region refers to a portion of an edge of the base electrode layer, and the second region refers to the remaining region of the edge of the base electrode layer.

According to an exemplary embodiment of the present disclosure, portions of the base electrode layers may be exposed, on which the resin electrode layers are not formed, such that current may flow from the outside to the internal electrodes, rather than through the resin electrode layers having lower conductivity than that of the base electrode layers. Therefore, equivalent series resistance (ESR) of the multilayer ceramic electronic component may be decreased.

Further, according to an exemplary embodiment of the present disclosure, the resin electrode layers may cover the second regions of the edges of the base electrode layers and thus have exposed portions of the edges of the base electrode layers, such that bending durability properties of a predetermined level or more may be secured.

According to an exemplary embodiment of the present disclosure, the base electrode layers may include main portions and extension portions extending from the main portions. Here, the resin electrode layers may not be formed on portions of the extension portions so as to decrease equivalent series resistance of the multilayer ceramic electronic component.

According to an exemplary embodiment of the present disclosure, the extension portion may serve as an ESR decreasing part.

According to an exemplary embodiment of the present disclosure, a multilayer ceramic electronic component having a relatively low equivalent series resistance and excellent durability and reliability may be provided.

Further, according to an exemplary embodiment of the present disclosure, a multilayer ceramic electronic component having excellent durability to a bending force may be provided.

In addition, according to an exemplary embodiment of the present disclosure, a method of manufacturing the multilayer ceramic electronic component, and a circuit board having the same, may be provided.

Hereinafter, exemplary embodiments of the present disclosure will be described in detail with reference to the accompanying drawings.

FIG. 1 is a perspective view illustrating a multilayer ceramic electronic component according to an exemplary embodiment of the present disclosure.

Figure 2:
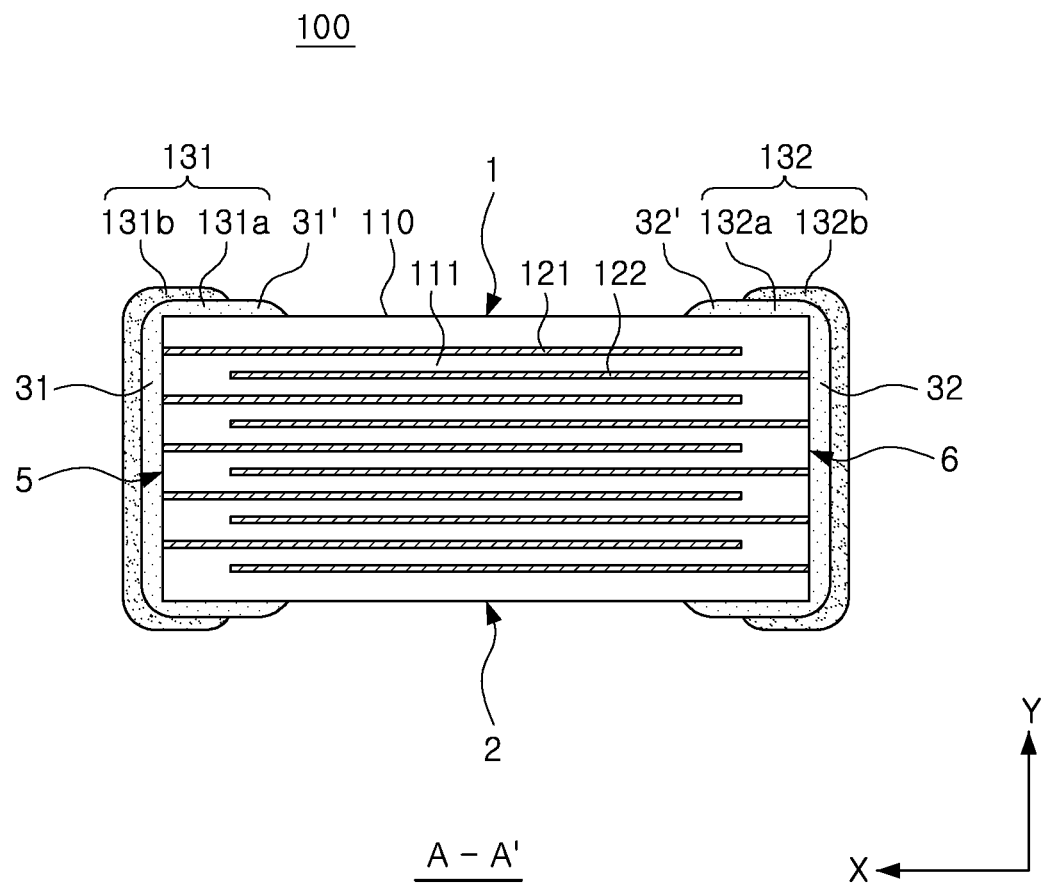
FIG. 2 is a cross-sectional view taken along line A-A' of FIG. 1.
Figure 3:
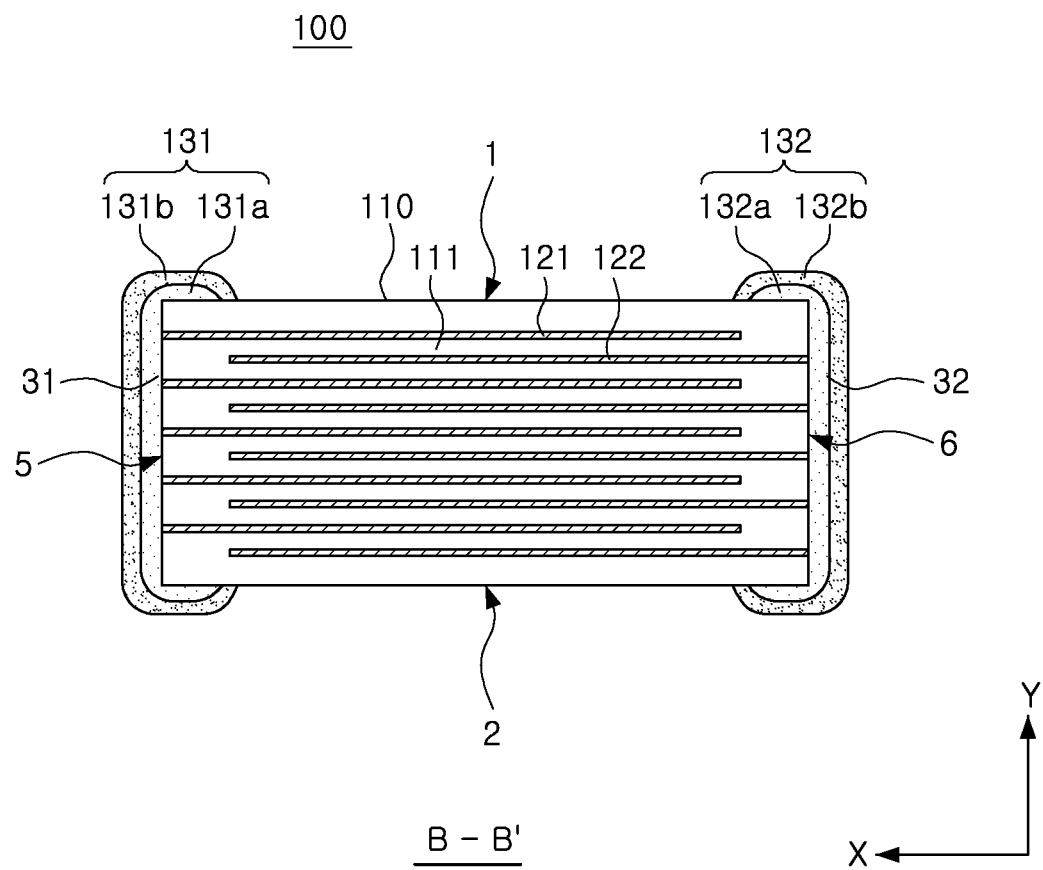
FIG. 3 is a cross-sectional view taken along line B-B' of FIG. 1.

FIG. 2 is a cross-sectional view taken along line A-A' of FIG. 1, and FIG. 3 is a cross-sectional view taken along line B-B' of FIG. 1.

Referring to FIG. 1, a multilayer ceramic electronic component 100 according to an exemplary embodiment of the present disclosure may include a ceramic body 110; and external electrodes 131 and 132.

The external electrodes 131 and 132 may include a first external electrode 131 and a second external electrode 132.

A shape of the ceramic body 110 is not particularly limited, but may be a hexahedral shape as illustrated in the drawings. At the time of sintering a chip, due to sintering shrinkage of ceramic powder, the ceramic body 110 may not have a perfectly hexahedral shape with completely straight lines, but may have a substantially hexahedral shape.

According to an exemplary embodiment of the present disclosure, the ceramic body 110 may have first and second surfaces 1 and 2 opposing each other in a first direction (y-direction), third and fourth surfaces 3 and 4 opposing each other in a second direction (z-direction) and connecting the first and second surfaces to each other, and fifth and sixth surfaces 5 and 6 opposing each other in a third direction (x-direction) and connecting the first and second surfaces to each other.

According to an exemplary embodiment of the present disclosure, the first direction (y-direction) may be a direction in which dielectric layers and internal electrodes disposed in the ceramic body are stacked.

As illustrated in FIG. 2, a cross-sectional view of the multilayer ceramic electronic component, the ceramic body 110 may include a plurality of dielectric layers 111 and internal electrodes 121 and 122 disposed on the dielectric layers 111. The internal electrodes may include first internal electrodes 121 and second internal electrodes 122, and the first and second internal electrodes may have voltages having opposing polarities applied thereto.

The ceramic body 110 may include an active layer as a part contributing to capacitance formation and upper and lower cover layers formed on upper and lower portions of the active layer, respectively, as upper and lower margin parts. The active layer may include dielectric layers 111 and internal electrodes 121 and 122, and a plurality of first and second internal electrodes 121 and 122 may be alternately formed with respective dielectric layers 111 interposed therebetween.

According to an exemplary embodiment of the present disclosure, the first direction (y-direction), a thickness direction of the ceramic body, refers to a direction in which the internal electrodes are stacked with respective dielectric layers interposed therebetween, the second direction (z-direction) refers to a width direction of the ceramic body, and the third direction (x-direction) refers to a length direction of the ceramic body.

According to an exemplary embodiment of the present disclosure, the ceramic body 110 may be formed to be longer in the length direction than in the width or thickness directions.

The plurality of dielectric layers 111 configuring the ceramic body 110 may be in a sintered state, and here, adjacent dielectric layers may be integrated with each other so that boundaries therebetween are not readily recognizable without a scanning electron microscope (SEM).

According to an exemplary embodiment of the present disclosure, the first and second internal electrodes 121 and 122, a pair of electrodes having opposing polarities, may be formed by printing a conductive paste containing a conductive metal on the dielectric layer 111 to a predetermined thickness and may be electrically insulated from each other by the dielectric layers 111 disposed therebetween.

According to an exemplary embodiment of the present disclosure, the first internal electrode 121 may be exposed to the fifth surface of the ceramic body, and the second internal electrode 122 may be exposed to the sixth surface of the ceramic body.

Further, the conductive metal contained in the first and second internal electrodes 121 and 122 may be nickel (Ni), copper (Cu), palladium (Pd), or an alloy thereof, but the present disclosure is not limited thereto.

The dielectric layer 111 may contain ceramic powder having high permittivity, for example, a barium titanate ($BaTiO_3$)-based power or a strontium titanate ($SrTiO_3$)-based power, but the present disclosure is not limited thereto.

According to an exemplary embodiment of the present disclosure, the first and second internal electrodes 121 and 122 may be electrically connected to the first and second external electrodes 131 and 132 through portions thereof exposed to the fifth and sixth surfaces 5 and 6 of the ceramic body 110, respectively. Therefore, when a voltage is applied to the first and second external electrodes 131 and 132, electric charges are accumulated between the first and second internal electrodes 121 and 122 facing each other. In this case, capacitance of the multilayer ceramic electronic component 100 may be in proportion to an area of an overlapped region between the first and second internal electrodes 121 and 122.

The upper and lower cover layers may have the same material and configuration as those of the dielectric layer 111 except that internal electrodes are not included therein. The upper and lower cover layers may be formed by stacking a one or two or more dielectric layers on upper and lower surfaces of the active layer in a vertical direction, respectively, and may serve to prevent the internal electrodes 121 and 122 from being damaged by physical or chemical stress.

The first external electrode 131 may be electrically connected to the first internal electrode 121, and the second external electrode 132 may be electrically connected to the second internal electrode 122.

According to an exemplary embodiment of the present disclosure, the first and second external electrodes 131 and 132 may include base electrode layers 131a and 132a and resin electrode layers 131b and 132b, respectively.

The base electrode layers 131a and 132a may be directly connected to the first and second internal electrodes 121 and 122, respectively, to secure electrical connectivity between the external electrodes and the internal electrodes.

The base electrode layers 131a and 132a may contain a conductive metal, and the conductive metal may be nickel (Ni), copper (Cu), palladium (Pd), gold (Au), or an alloy thereof, but the present disclosure is not limited thereto.

The base electrode layers 131a and 132a may be sintered electrodes formed by sintering of a paste containing the conductive metal.

In detail, the base electrode layers 131a and 132a may be formed by sintering a paste containing glass and copper as the conductive metal.

According to an exemplary embodiment of the present disclosure, the resin electrode layers 131b and 132b may be disposed on the base electrode layers 131a and 132a, while not being formed on portions of the base electrode layers 131a, 132a to be exposed thereby, respectively.

The resin electrode layers 131b and 132b may be formed on the base electrode layers 131a and 132a, such that portions of edges of the base electrode layers 131a and 132a are exposed, on which the resin electrode layers are not formed, and the remaining portions thereof are covered by the resin electrode layers 131b, 132b.

According to an exemplary embodiment of the present disclosure, the base electrode layers 131a and 132a and the resin electrode layers 131b and 132b may extend from the fifth and sixth surfaces of the ceramic body to at least one of the first to fourth surfaces. For example, the base electrode layers 131a and 132a and the resin electrode layers 131b and 132b may extend from the fifth and sixth surfaces to cover portions of the first to fourth surfaces.

However, even in the case that the base electrode layers 131a, 132a and the resin electrode layers 131b, 132b extend to first and second surfaces or third and fourth surfaces, the resin electrode layers 131b, 132b may cover portions of the edges of the base electrode layers 131a, 132a while partially exposing the regions of the edges thereof.

According to an exemplary embodiment of the present disclosure, the base electrode layers 131a and 132a are not completely covered by the resin electrode layers 131b and 132b, but are partially exposed, such that current may flow from the outside to the internal electrodes 121, 122, rather than through the resin electrode layers 131b, 132.

In the case in which a multilayer ceramic electronic component is manufactured in a manner in which resin electrode layers entirely cover base electrode layers, current flows through the resin electrode layers to form an external electrical connection.

The resin electrode layers 131b and 132b may contain conductive powder for securing electrical conductivity and a base resin for absorbing impacts. In the case in which resin electrode layers contain a base resin, durability of a multilayer ceramic electronic component to external stress as in an occurrence of bending therein may be improved, but the resin electrode layers have a relatively high specific resistance value as compared to electrodes that do not contain a base resin, such that equivalent series resistance (ESR) of the multilayer ceramic electronic component may be increased.

However, as in an exemplary embodiment of the present disclosure, in the case in which the resin electrode layers 131b and 132b are disposed so that the base electrode layers 131a and 132a are not entirely covered, but portions of the edges of the base electrode layers 131a and 132a are exposed, current may not pass through the resin electrode layers 131b, 132b, but may flow externally from the internal electrodes 121, 122 through the base electrode layers 131a, 132a.

In the case in which the number of paths through which current may flow is large, since current mainly flows through a path of which specific resistance is relatively low, according to an exemplary embodiment of the present disclosure, current may not pass through the resin electrode layers, but may flow through the exposed edges of the base electrode layers 131a and 132a, such that external current may be applied to the internal electrodes 121, 122.

For example, according to an exemplary embodiment of the present disclosure, current may flow externally via the internal electrodes and subsequently via the base electrode layers, and thus, an increase in equivalent series resistance by the resin electrode layers may be prevented.

For example, when the resin electrode layers are formed on portions of the base electrode layers so that the base electrode layers are partially exposed as in an exemplary embodiment of the present disclosure, since equivalent series resistance of the multilayer ceramic electronic component may decrease, a degree of freedom for a content of the conductive powder of the resin electrode layers may be increased.

For example, in the case in which there exists a need to further improve impact absorption efficiency of the multilayer ceramic electronic component, a content of the base resin contained in the resin electrode layers may be increased and a content of the conductive powder may be decreased.

The resin electrode layers 131b and 132b may contain a thermosetting polymer, for example, an epoxy resin, an acrylic resin or a mixture thereof, but are not limited thereto.

The resin electrode layers 131b and 132b may contain metal powder as the conductive powder. For example, the resin electrode layers 131b and 132b may contain silver (Ag), copper (Cu), nickel, or the like.

According to an exemplary embodiment of the present disclosure, as illustrated in FIG. 1, the base electrode layers 131a and 132a may contain main portions 31 and 32 connected to the internal electrodes and extension portions 31' and 32' extended from the main portions. The resin electrode layers 131b and 132b may be disposed so that end portions of the extension portions 31' and 32' are exposed.

For example, the resin electrode layers 131b and 132b may be disposed to entirely cover the main portions 31 and 32 and portions of the extension portions 31' and 32' adjacent to the main portions 31 and 32 and to expose the remaining portions thereof, for example, including the end portions of the extension portions.

According to an exemplary embodiment of the present disclosure, the main portions 31 and 32 may be disposed on the fifth and sixth surfaces of the ceramic body and connected to exposed end portions of the internal electrodes.

The main portions 31 and 32 may be extended from the fifth and sixth surfaces to at least one of the first to fourth surfaces of the ceramic body 110.

The extension portions 31' and 32' may be extended from the main portions 31 and 32 and may be disposed on outer surfaces of the ceramic body 110.

According to an exemplary embodiment of the present disclosure, the extension portions 31' and 32' may be respectively disposed on at least one of the first to fourth surfaces of the ceramic body 110 and respectively extended from the main portions 31 and 32 in the length (x-direction) of the ceramic body 110.

The main portions 31 and 32 may be formed by a method of dipping the fifth and sixth surfaces of the ceramic body 110 in a paste for the formation of a base electrode layer, and a degree of extension of the main portions 31 and 32 to the first to fourth surfaces of the ceramic body 110 may be adjusted by a dipping depth.

The extension portions 31' and 32' may be formed by printing the paste for the formation of the base electrode layers on the outer surfaces of the ceramic body 110 to be connected to the main portions 31 and 32.

According to an exemplary embodiment of the present disclosure, the extension portion may be formed to have a width narrower than that of the main portion.

According to an exemplary embodiment of the present disclosure, the extension portion may be formed to have a width narrower than a width of the outer surface of the ceramic body 110 on which the extension portion is disposed.

The width of the outer surface of the ceramic body 110 on which the extension portion is disposed may be measured in a direction parallel to a width direction of the extension portion, and the width direction of the extension portion may be a direction perpendicular to a direction in which the extension portion is extended.

The width of the extension portion may be measured in the direction perpendicular to the direction in which the extension portion is extended.

For example, when the extension portion is disposed on the first surface of the ceramic body 110, the extension portion disposed on the first surface of the ceramic body 110 may be formed to have a width narrower than that of the first surface of the ceramic body 110 measured in the direction parallel to the width direction of the extension portion. Further, when the extension portion is disposed on the second surface of the ceramic body 110, the extension portion disposed on the second surface of the ceramic body 110 may be formed to have a width narrower than that of the second surface of the ceramic body 110 measured in the direction parallel to the width direction of the extension portion.

According to an exemplary embodiment of the present disclosure, an exposed region of the extension portion, on which the resin electrode layer is not formed, may have a width narrower than that of the outer surface of the ceramic body 110 on which the extension portion is disposed, such that equivalent series resistance of the multilayer ceramic electronic component may be decreased, and durability to bending force may be improved by a decrease in an area of the base electrode layer.

In the case in which the extension portion is not separately formed but the main portion is extended to a region in the case that the end portion of the extension portion will be disposed, by increasing the dipping depth at the time of forming the main portion, durability to bending force may not be secured due to an increase in the area of the base electrode layer, and the base electrode layer may be formed to be relatively thick.

However, when the extension portion is formed to have a width narrower than that of the outer surface of the ceramic body 110 on which the extension portion is disposed as in the exemplary embodiment of the present disclosure, durability to bending force may be secured. Further, in the case of forming the extension portion separately from the main portion, a problem of an increase in the thickness of the base electrode layer may be solved.

FIG. 2 is a cross-sectional view taken along line A-A' crossing a region in which the extension portion is disposed in FIG. 1, and FIG. 3 is a cross-sectional view taken along line B-B' crossing a region on which the extension portion is not disposed in FIG. 1.

Referring to FIG. 2, a cross-sectional view of the region on which the extension portion is disposed, an end portion of the extension portion may be exposed, on which the resin electrode layer is not formed. In other words, the edge of the base electrode layer may be exposed, on which the resin electrode layer is not formed.

Referring to FIG. 3, a cross-sectional view of the region on which the extension portion is not disposed, it may be confirmed that the edge of the base electrode layer is covered by the resin electrode layer. The resin electrode layer covers the edge of the base electrode layer in the region in which the extension portion is not disposed, such that durability to a bending force applied to the multilayer ceramic electronic component may be improved.

Figure 4A:
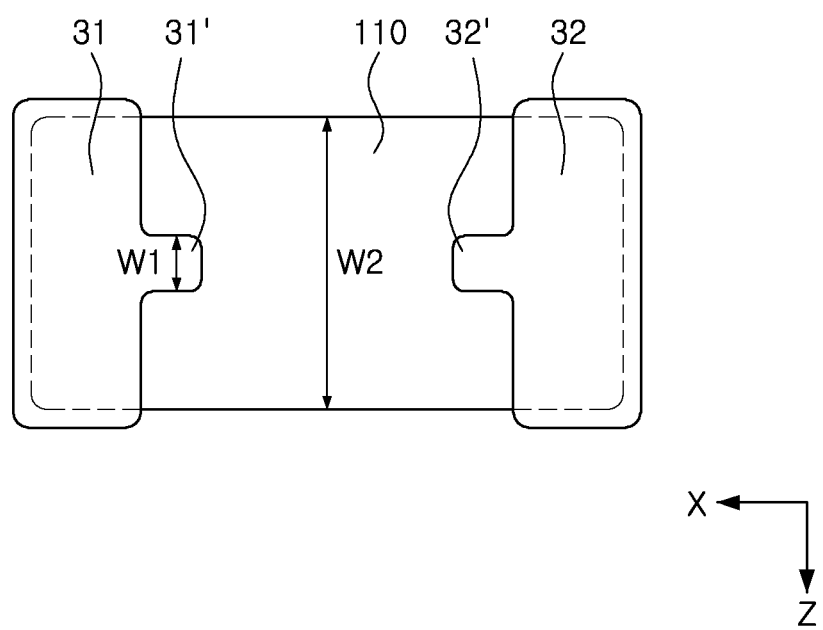
FIGS. 4A through 4C are plan views illustrating a ceramic body and base electrode layers of the multilayer ceramic electronic component according to the exemplary embodiment of the present disclosure.

FIG. 4A is a plan view illustrating the ceramic body 110 and the base electrode layers of the multilayer ceramic electronic component according to an exemplary embodiment of the present disclosure.

Referring to FIG. 4A, according to an exemplary embodiment of the present disclosure, when the width of the extension portion is defined as W1, and a width of one surface of the ceramic body 110 on which the extension portion is disposed, measured in the direction parallel to the width direction of the extension portion is defined W2, W1/W2 may satisfy W1/W2≤0.5.

In detail, the width W1 of the extension portion may be 1 μm or more.

W1 may refer to a widest width of an exposed region of the extension portion, in which the resin electrode layer is not formed, measured in the width direction thereof.

In the case in which W1 is less than 1 μm, an effect of decreasing equivalent series resistance (ESR) may not be significant, and in the case in which W1/W2 is more than 0.5, bending durability properties may be deteriorated, such that generation of bending cracks may be increased.

A length of the exposed region of the extension portion in which the resin electrode layer is not formed may be fpm or more. The length of the extension portion may be measured in a direction in which the extension portion is extended.

Figure 4B:
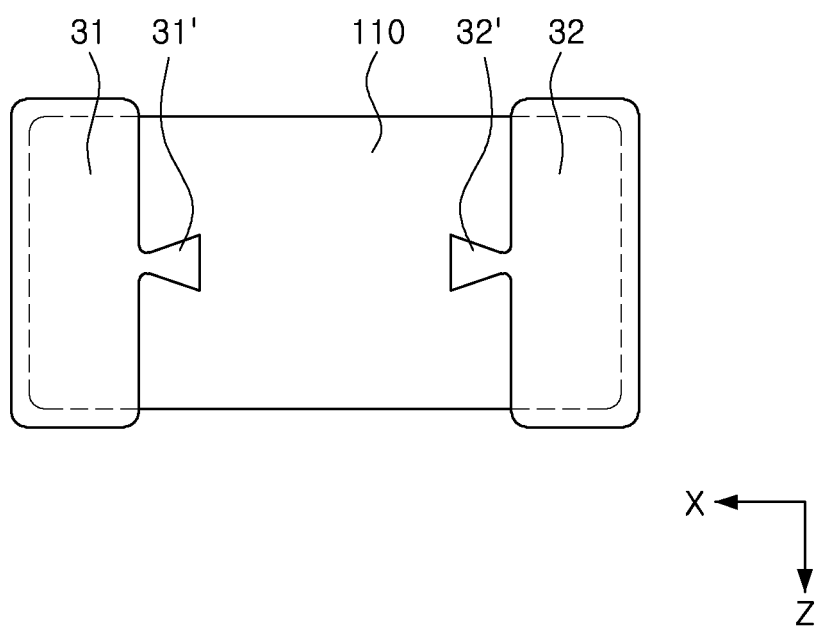
Figure 4C:
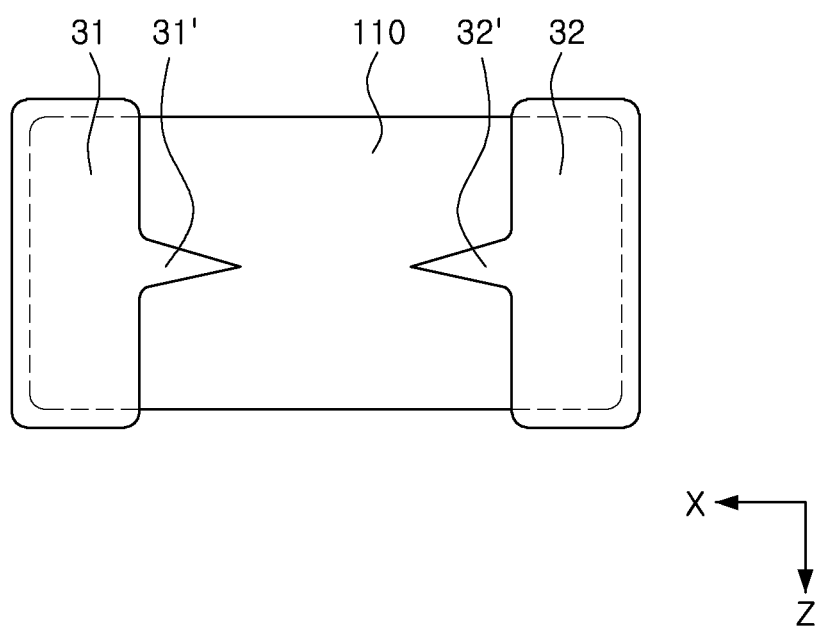

FIGS. 4B and 4C are plan views illustrating the ceramic body 110 and the base electrode layers of the multilayer ceramic electronic component in order to illustrate modified examples of a shape of the extension portion of the multilayer ceramic electronic component according to an exemplary embodiment of the present disclosure.

Referring to FIG. 4B, the extension portions 31' and 32' may have a shape in which widths thereof are increased in a direction in which the extension portions are extended from the main portions 31 and 32, respectively.

Referring to FIG. 4C, the extension portions 31' and 32' may have a shape in which widths thereof are decreased in the direction in which the extension portions are extended from the main portions 31 and 32, respectively.

Figure 5A:
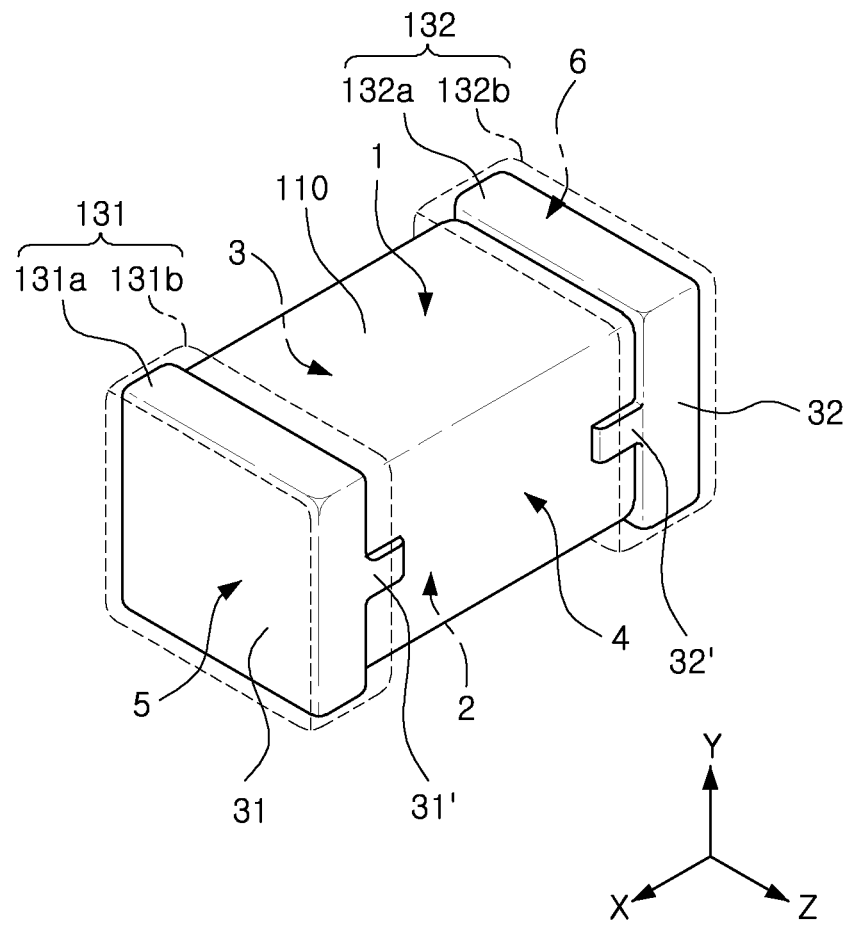
FIGS. 5A and 5B are perspective views schematically illustrating a multilayer ceramic electronic component in order to illustrate a modified example of the base electrode layer.
Figure 5B:
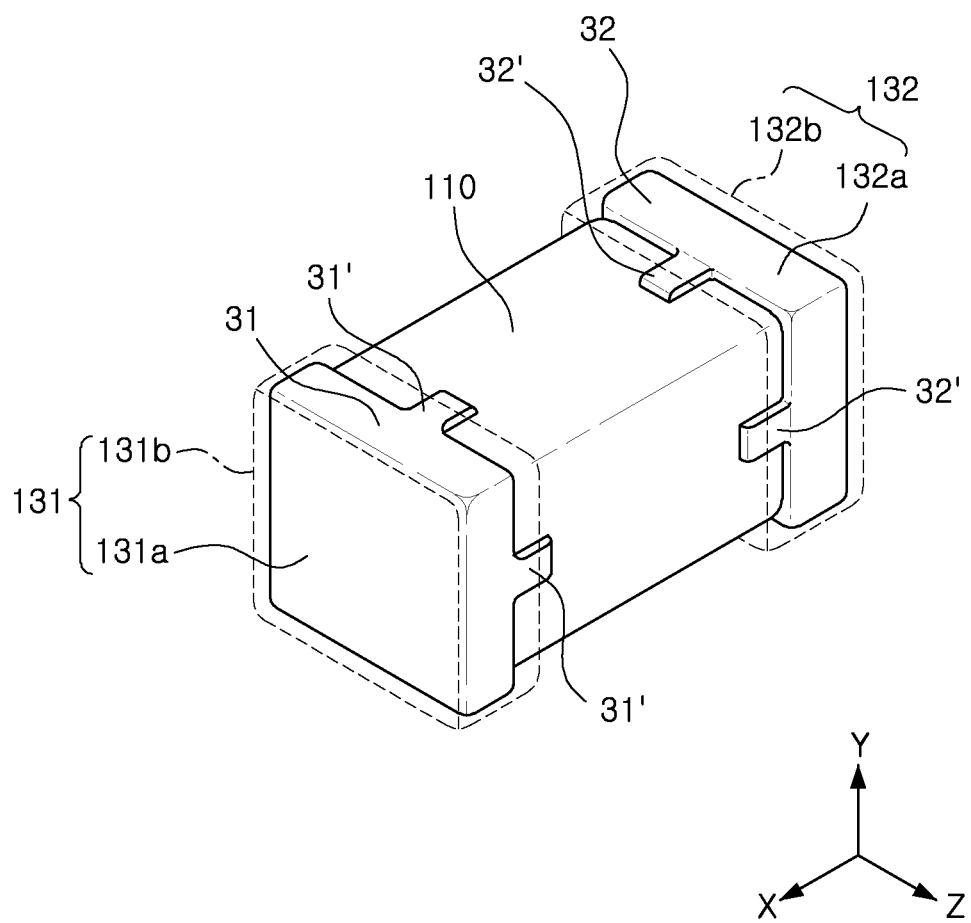

FIGS. 5A and 5B are perspective views schematically illustrating the multilayer ceramic electronic component to illustrate a modified example of the base electrode layer.

The extension portion may be disposed on at least one of the first and second surfaces opposing each other in the thickness direction of the ceramic body 110 as illustrated in FIG. 1.

For example, the extension portion may be disposed on the first and second surfaces of the ceramic body 110.

Alternatively, the extension portion may be disposed on at least one of the third and fourth surfaces opposing each other in the width direction of the ceramic body 110 as illustrated in FIG. 5A.

For example, the extension portion may be disposed on the third and fourth surfaces.

Alternatively, the extension portions may be disposed on the first to fourth surfaces of the ceramic body 110, respectively, as illustrated in FIG. 5B.

Figure 6:
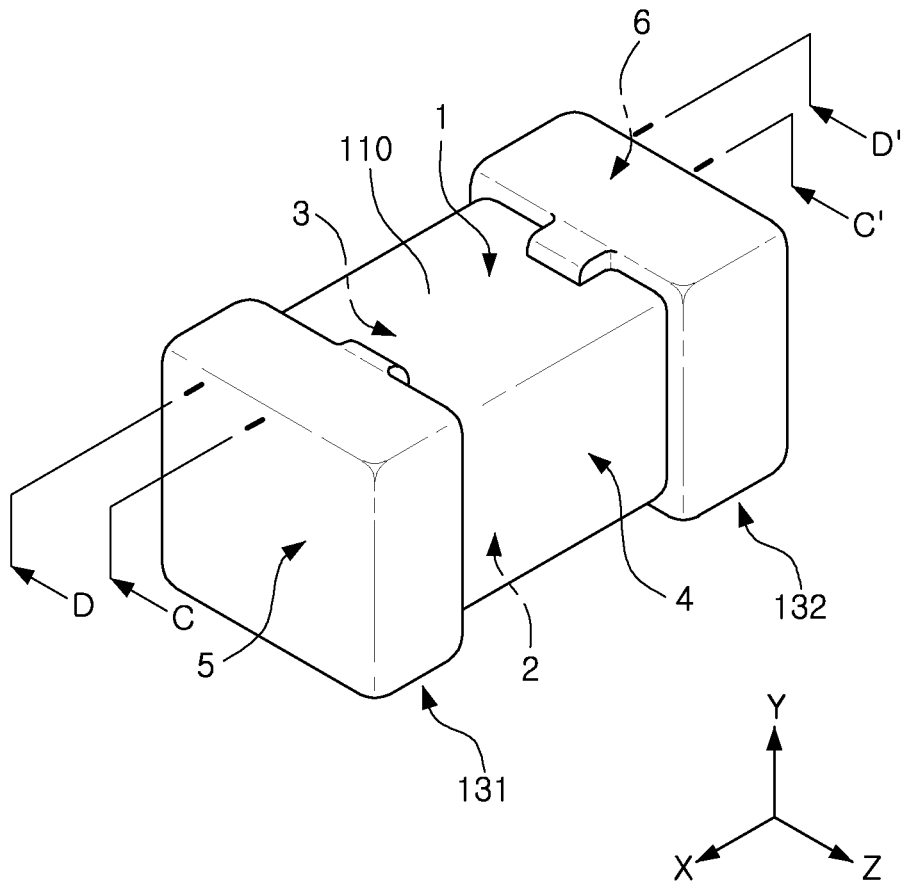
FIG. 6 is a perspective view illustrating a multilayer ceramic electronic component according to another exemplary embodiment of the present disclosure.

FIG. 6 is a perspective view illustrating a multilayer ceramic electronic component according to another exemplary embodiment of the present disclosure.

Figure 7:
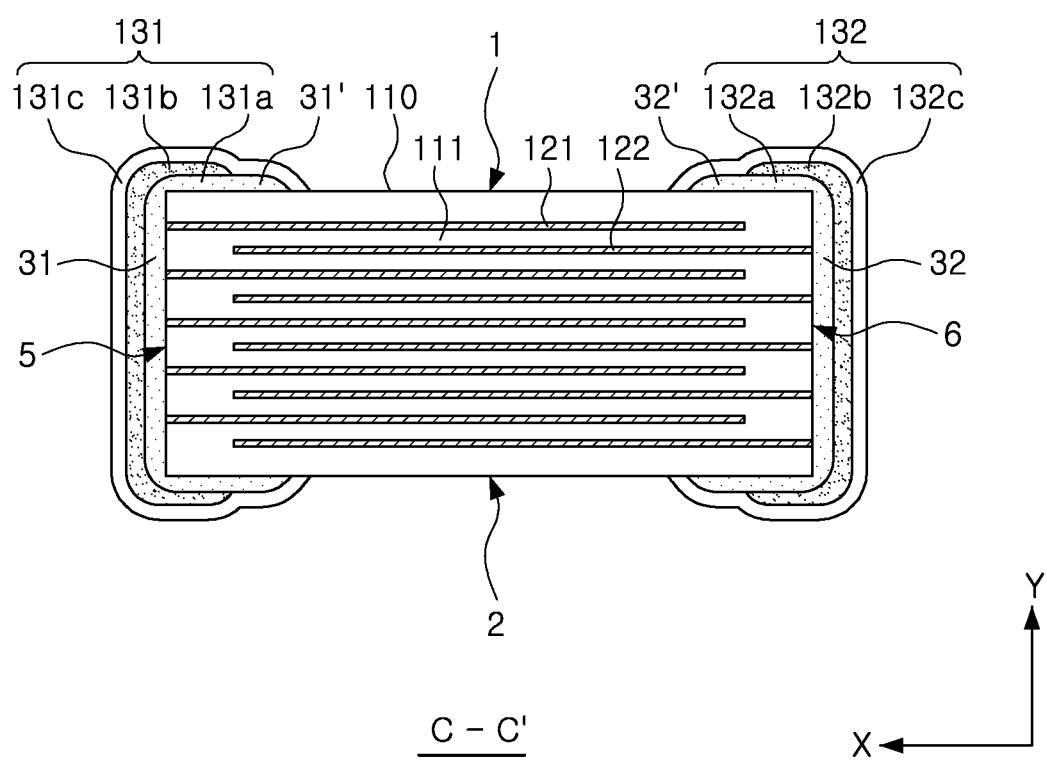
FIG. 7 is a cross-sectional view taken along line C-C' of FIG. 6.
Figure 8:
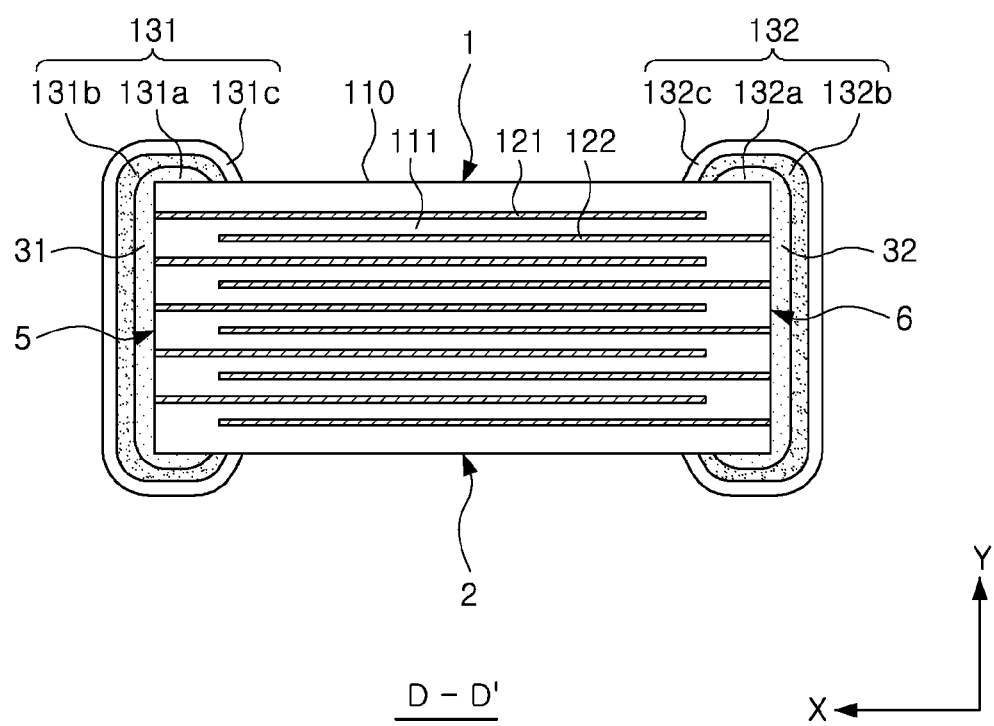
FIG. 8 is a cross-sectional view taken along line D-D' of FIG. 6.

FIG. 7 is a cross-sectional view taken along line C-C' of FIG. 6, and FIG. 8 is a cross-sectional view taken along line D-D' of FIG. 6.

Referring to FIG. 6, a multilayer ceramic electronic component according to another exemplary embodiment of the present disclosure may include a ceramic body 110; and external electrodes 131 and 132.

The first and second external electrodes 131 and 132 may further include plating layers disposed on the resin electrode layers of the first and second external electrodes of the multilayer ceramic electronic component according to the foregoing exemplary embodiment of the present disclosure.

Referring to FIGS. 7 and 8, the first and second external electrodes 131 and 132 of the multilayer ceramic electronic component according to another exemplary embodiment of the present disclosure may include base electrode layers 131a and 132a, resin electrode layers 131b and 132b formed so that portions of edges of the base electrode layers 131a and 132a are exposed, and plating layers 131c and 132c, respectively.

In descriptions of the multilayer ceramic electronic component according to an exemplary embodiment of the present disclosure, descriptions overlapping with those of the multilayer ceramic electronic component according to the foregoing exemplary embodiment of the present disclosure will be omitted, and a difference therebetween will be mainly described below.

The plating layers 131c and 132c may be formed on the resin electrode layers 131b and 132b and disposed to come into direct contact with exposed regions of the base electrode layers 131a and 132a on which the resin electrode layers are not formed, respectively. Therefore, the base electrode layers 131a and 132a and the plating layers 131c and 132c may be directly electrically connected to each other, respectively.

The plating layers 131c and 132c may be disposed to cover end portions of the extension portions 31' and 32' on which the resin electrode layers 131b and 132b are not formed, respectively.

The plating layers 131c and 132c may be formed to entirely cover the resin electrode layers 131b and 132b and portions of regions of the base electrode layers 131a and 132a on which the resin electrode layers 131b and 132b are not formed.

For example, when the plating layers 131c and 132c are formed, current may flow through a path from the internal electrodes to the outside through the base electrode layers and the plating layers, and an increase in an equivalent series resistance by the resin electrode layers may be prevented similarly to the foregoing exemplary embodiment of the present disclosure.

The plating layers 131c and 132c may contain nickel (Ni) or tin (Sn), but are not limited thereto.

The plating layers 131c and 132c may be configured of a double layer. For example, nickel (Ni) plating layers may be formed on the resin electrode layers, and tin (Sn) plating layers may be formed on the nickel (Ni) plating layers, but the present disclosure is not limited thereto.

Method of Manufacturing Multilayer Ceramic Electronic Component

According to another exemplary embodiment of the present disclosure, a method of manufacturing a multilayer ceramic electronic component is provided.

Figure 9:
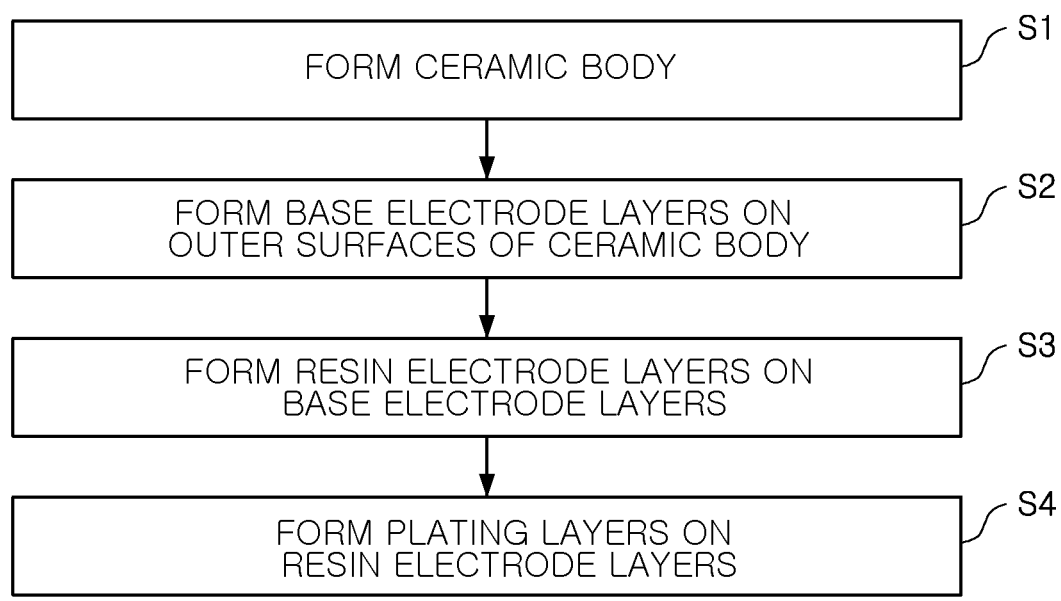
FIG. 9 is a flow chart illustrating a method of manufacturing a multilayer ceramic electronic component according to another exemplary embodiment of the present disclosure.

FIG. 9 is a flow chart illustrating a method of manufacturing a multilayer ceramic electronic component according to another exemplary embodiment of the present disclosure.

Referring to FIG. 9, the method of manufacturing a multilayer ceramic electronic component according to another exemplary embodiment of the present disclosure may include: forming a ceramic body (S1); forming base electrode layers on outer surfaces of the ceramic body (S2); and forming resin electrode layers on the base electrode layers (S3).

Hereinafter, a method of manufacturing a multilayer ceramic electronic component according to another exemplary embodiment of the present disclosure will be described, but the present disclosure is not limited thereto.

In descriptions of the method of manufacturing a multilayer ceramic electronic component according to the exemplary embodiment of the present disclosure, a description overlapped with that of the multilayer ceramic electronic component according to the foregoing exemplary embodiment of the present disclosure will be omitted.

In the forming of the ceramic body, slurry containing powder such as barium titanate ($BaTiO_3$) powder, or the like, may be applied to and dried on a carrier film to prepare a plurality of ceramic green sheets, thereby forming dielectric layers and cover layers.

The ceramic green sheet may be manufactured by mixing the ceramic powder, a binder, and a solvent with each other to prepare the slurry and by manufacturing a sheet having a thickness of several μm using the prepared slurry via a doctor blade method.

Next, an internal electrode conductive paste containing conductive powder may be prepared.

After the internal electrode conductive paste is applied onto the green sheets by a screen printing method to form internal electrodes, a plurality of green sheets on which the internal electrodes are printed may be stacked, and a plurality of green sheets on which the internal electrode is not printed may be stacked on upper and lower surfaces of a laminate, followed by sintering, thereby manufacturing a ceramic body. The ceramic body may include the internal electrodes, the dielectric layers, and the cover layers, and here, the dielectric layers may be formed to have the internal electrodes formed thereon, by sintering the green sheets on which the internal electrode is printed, and the cover layers are formed by sintering the green sheets on which the internal electrode is not printed.

Then, base electrode layers may be formed on outer surfaces of the ceramic body to be electrically connected to the internal electrodes.

At the time of forming the base electrode layers, third and fourth surfaces of the ceramic body to which the internal electrodes are exposed may be dipped in a paste for the formation of a base electrode layer so as to form main portions 31 and 32 thereon. Thereafter, in order to form extension portions 31' and 32', the paste for the formation of a base electrode layer may be additionally applied to the outer surface of the ceramic body to be connected to the paste applied to form the main portions 31 and 32, and then the paste for the formation of a base electrode layer may be sintered, such that the base electrode layers may be formed. Application of the paste for the formation of the extension portions may be performed using a process of printing the paste for the formation of a base electrode layer on the outer surface of the ceramic body.

The base electrode layers may be formed by sintering a paste containing a conductive metal and glass.

The conductive metal is not particularly limited, but may be, for example, one or more selected from the group consisting of copper (Cu), silver (Ag), nickel (Ni), and an alloy thereof, and in further detail, may contain copper (Cu).

The glass is not particularly limited, but may be a material having the same composition as that of glass used for the formation of external electrodes of a multilayer ceramic electronic component according to the related art.

Then, resin electrode layers may be formed by applying a resin composition onto the base electrode layers and then curing the applied resin composition. The resin composition may contain a conductive powder and a base resin, and here, the base resin may be an epoxy resin, a thermosetting resin, but is not limited thereto.

According to an exemplary embodiment of the present disclosure, since the extension portion is formed to have a width narrower than that of the main portion, the resin composition may be applied by dipping the ceramic body on which the base electrode layers are formed in the resin composition.

Further, the method of manufacturing a multilayer ceramic electronic component may further include, after forming of the resin electrode layers, forming plating layers on the resin electrode layers, and the plating layers may include nickel plating layers and tin plating layers formed on the nickel plating layers.

Circuit Board 200 Having Electronic Component

According to an exemplary embodiment of the present disclosure, a circuit board having the multilayer ceramic electronic component according to an exemplary embodiment or another exemplary embodiment of the present disclosure.

Figure 10:
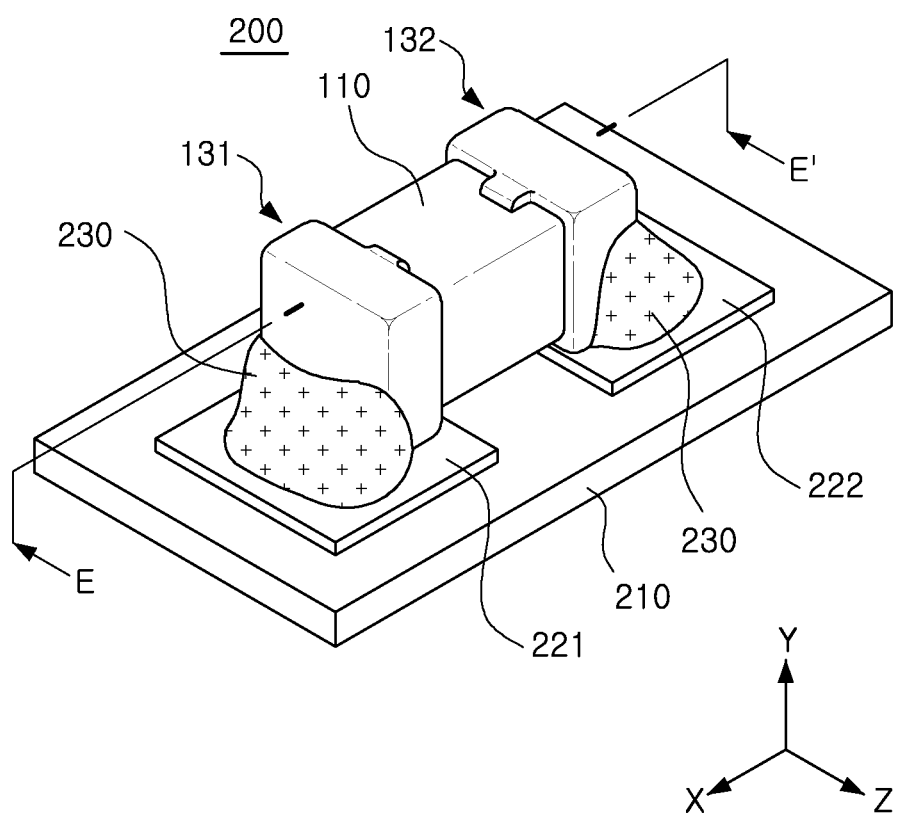
FIG. 10 is a perspective view illustrating a circuit board on which the multilayer ceramic electronic component according to another exemplary embodiment of the present disclosure is mounted.

FIG. 10 is a perspective view illustrating a circuit board on which the multilayer ceramic electronic component according to another exemplary embodiment of the present disclosure is mounted.

Figure 11:
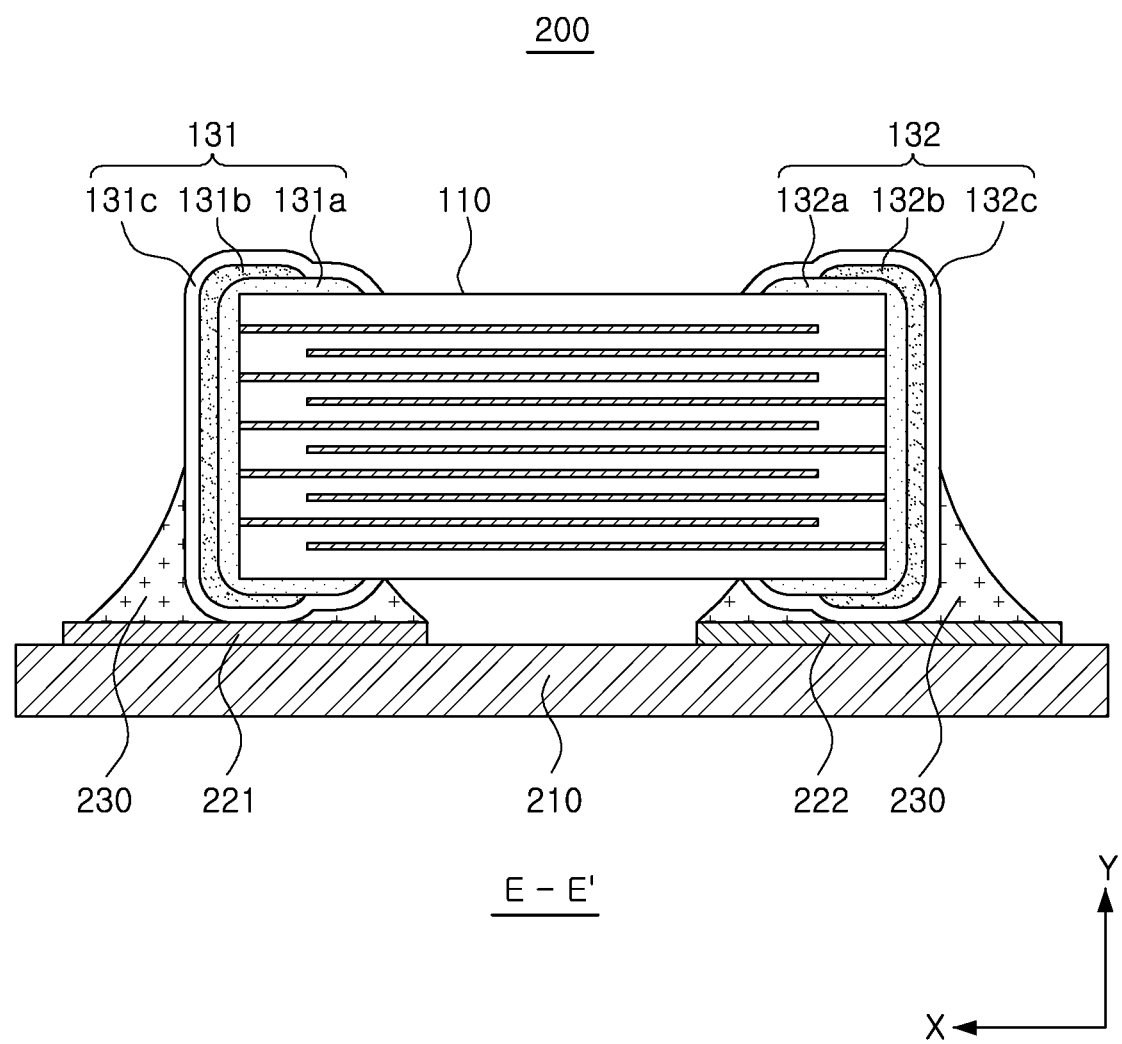
FIG. 11 is a cross-sectional view taken along line E-E' of FIG. 10.

FIG. 11 is a cross-sectional view taken along line E-E' of FIG. 10.

Referring to FIGS. 10 and 11, the circuit board having an electronic component according to the exemplary embodiment of the present disclosure may include a printed circuit board 210 on which first and second electrode pads 221 and 222 are formed; and a multilayer ceramic electronic component 100 installed on the printed circuit board 210.

In this case, the multilayer ceramic electronic component 100 may be electrically connected to the printed circuit board 210 by solders 230 in a state in which first and second external electrodes 131 and 132 are positioned on the first and second electrode pads 221 and 222 to come in contact with each other, respectively.

A description of the circuit board having a multilayer ceramic electronic component overlapped with that of the multilayer ceramic electronic component according to the foregoing exemplary embodiment of the present disclosure will be omitted in order to avoid an overlapped description.

EXPERIMENTAL EXAMPLE

Figure 12A:
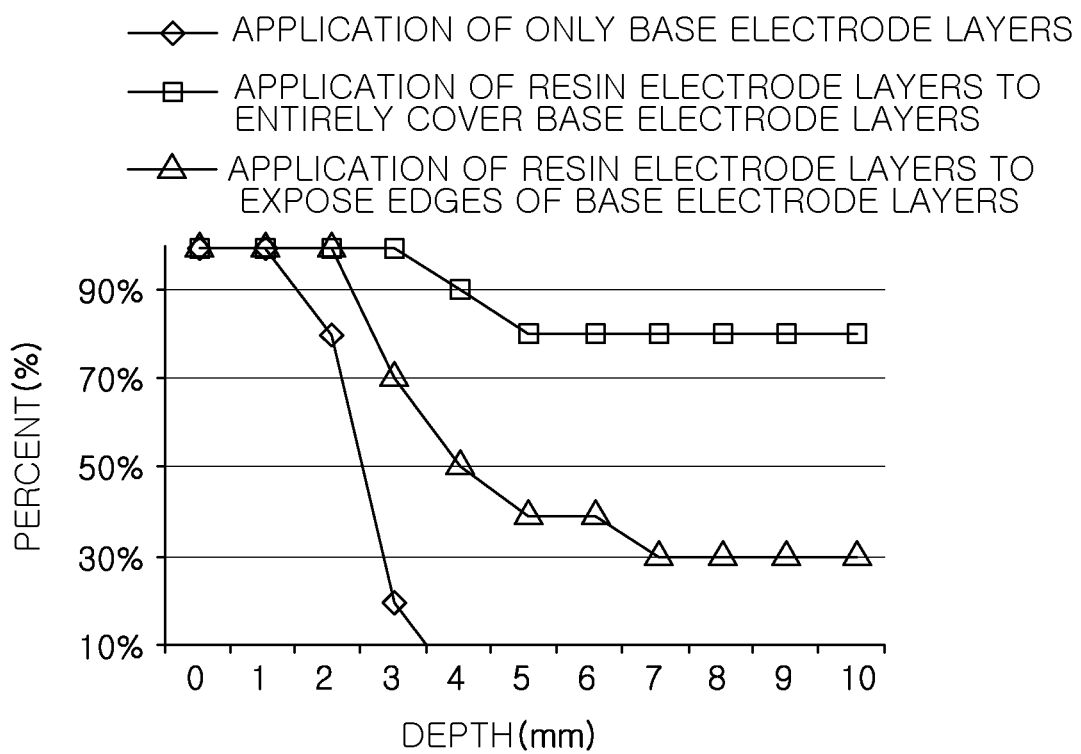
FIG. 12A is a graph illustrating bending durability test results of a multilayer ceramic electronic component in Comparative Example.

FIG. 12A is a graph illustrating bending durability test results of plated chips of a multilayer ceramic electronic component (Comparative Example 1) including external electrodes in which resin electrode layers were not applied on base electrode layers, a multilayer ceramic electronic component (Comparative Example 2) including external electrodes in which resin electrode layers were disposed to cover the base electrode layers entirely, and a multilayer ceramic electronic component (Comparative Example 3) including external electrodes in which resin electrode layers were disposed to expose the entire edges of base electrode layers.

In Comparative Examples 1 to 3, the external electrodes were extended from both surfaces of the ceramic body opposing each other in a length direction of the ceramic body to portions of both surfaces of the ceramic body opposing each other in a thickness direction thereof and to portions of both surfaces thereof opposing each other in a width direction of the ceramic body, and the base electrode layers were formed in a manner in which only main portions were included but extension portions were not included therein.

Figure 12B:
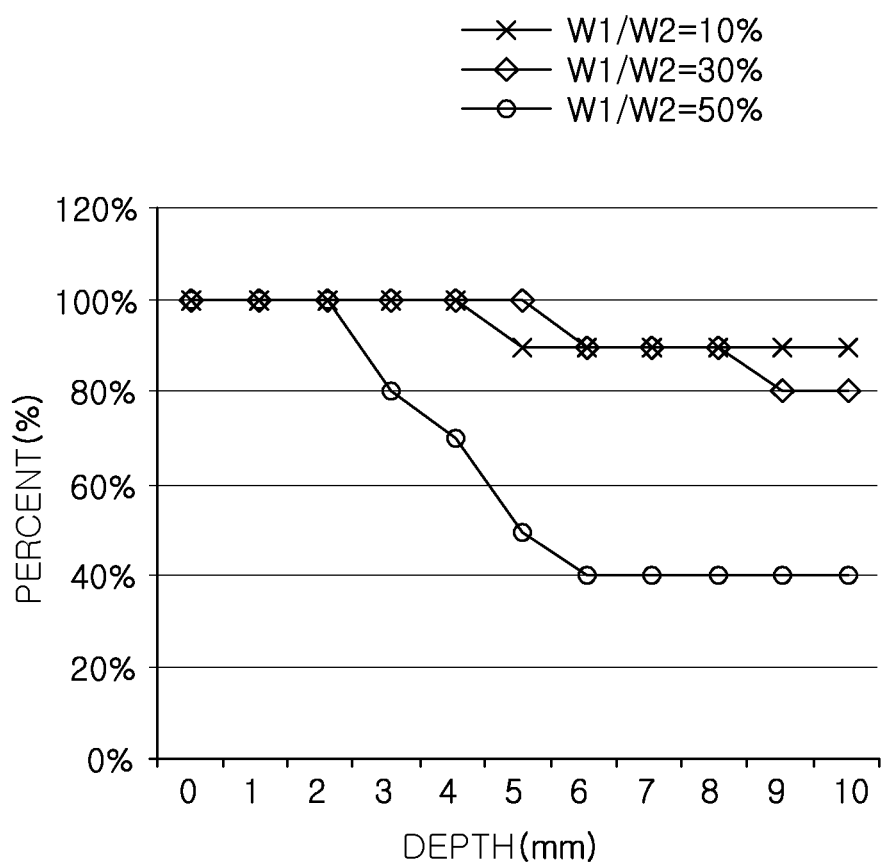
FIG. 12B is a graph illustrating bending durability test results depending on W1/W2 in the multilayer ceramic electronic component according to another exemplary embodiment of the present disclosure.

FIG. 12B is a graph illustrating bending durability test results depending on a ratio (W1/W2) of a width W1 of the extension portion to a width W2 of an outer surface of the ceramic body 110 on which the extension portions 31' and 32' were disposed in the multilayer ceramic electronic components according to another exemplary embodiment of the present disclosure.

Figure 13:
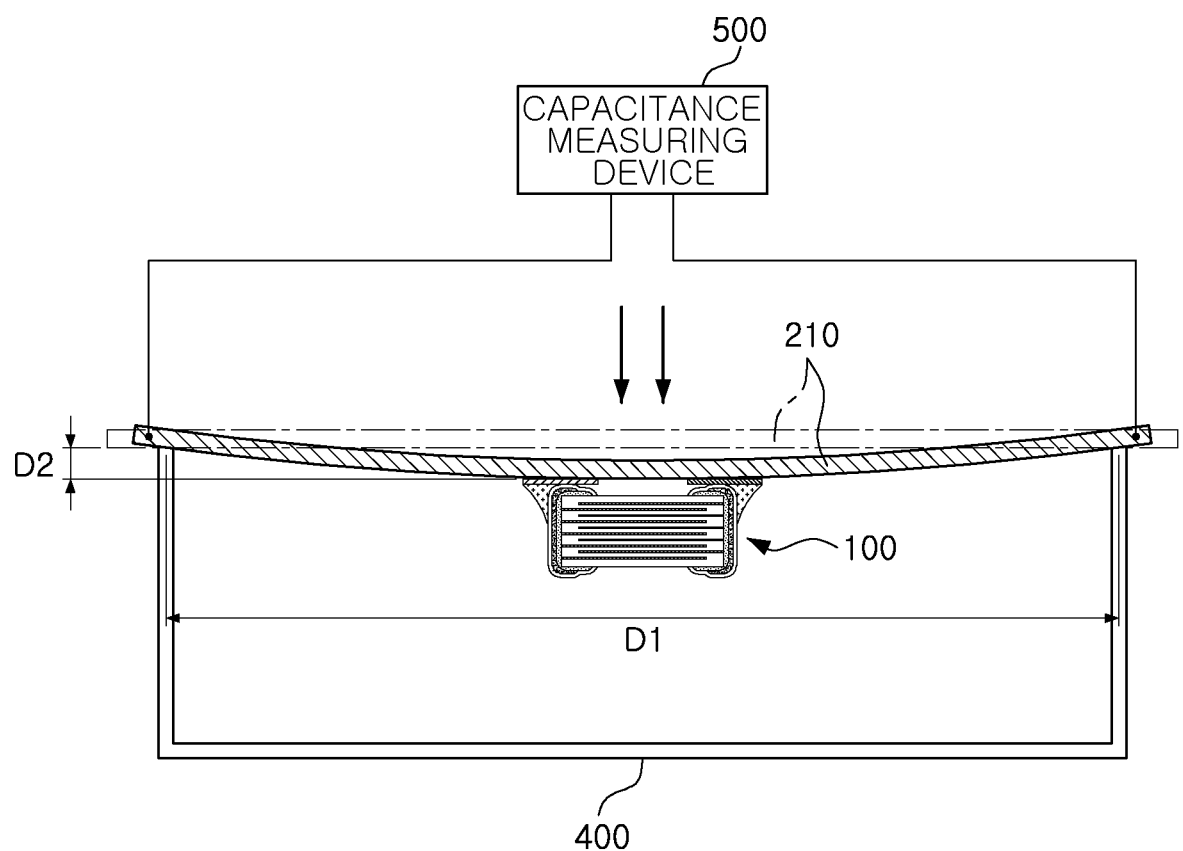
FIG. 13 is a view illustrating a method of evaluating bending durability properties.

Bending durability properties were measured by a method illustrated in FIG. 13. As illustrated in FIG. 13, a board 210 on which a multilayer ceramic electronic component is mounted is disposed so that the multilayer ceramic electronic component 100 faces the ground, and a support 400 including an accommodation groove capable of accommodating the multilayer ceramic electronic component was disposed under the board.

A width D1 of the groove provided in the support 400 was about 8 cm. In addition, capacitance may be measured in real time by connecting a capacitance measuring device 500, which is capacitance measuring equipment, to both ends of the support, such that a decrease in capacitance of the multilayer ceramic electronic component may be confirmed.

As the multilayer ceramic electronic component, a multilayer ceramic electronic component having a 1608 size (length×width×thickness: about 1.6 mm×0.8 mm×0.8 mm) was used.

The multilayer ceramic electronic component 100 was positioned in a central portion of the support 400, and an upper surface of the board 210 in a position corresponding to that of the multilayer ceramic electronic component had pressure applied thereto, such that the board 210 was bent downwardly by a bending amount D2 from a horizontal axis of FIGS. 12A and 12B. In this case, whenever the multilayer ceramic electronic component descended by 1 mm, the multilayer ceramic electronic component was maintained in this state for 5 seconds, and the descent and maintenance were repeated up to a final depth. Capacitance of the multilayer ceramic electronic component was continuously measured during the process as described above, such that when a capacitance change rate based on initial capacitance was ±10% or more, the capacitance was judged as defective.

Vertical axes of FIGS. 12A and 12B indicate a rate (survival rate %) of the multilayer ceramic electronic component in which a defect did not occur.

Referring to FIG. 12A, in the case of Comparative Example 1 in which the resin electrode layers were not disposed, the survival rate was the lowest, and in the case of Comparative Example 2 in which the resin electrode layers were applied to cover the base electrode layers entirely, the survival rate was the highest.

However, in the case of Comparative Example 2, there was a problem that equivalent series resistance was relatively high.

Referring to FIG. 12B, in the case in which W1/W2 was 0.5, bending durability properties were improved as compared to Comparative Examples 1 and 3. Further, in the case in which W1/W2 was 0.1 or 0.2, bending durability properties were secured at a level similar to that in Comparative Example 2 in which the resin electrode layers covered the entire base electrode layers.

In the case of Embodiment of the present disclosure illustrated in FIG. 12B, it may be appreciated that the extension portions 31' and 32', on which the resin electrode layers are not formed, were included, such that equivalent series resistance was decreased and bending durability properties were also secured.

The following Table 1 illustrates equivalent series resistance (ESR) test results depending on a width W1 of extension portions 31' and 32' in a multilayer ceramic electronic component (sample 1) including external electrodes in which resin electrode layers were not applied on base electrode layers, a multilayer ceramic electronic component (sample 2) including external electrodes in which resin electrode layers were disposed to cover the base electrode layers entirely, and multilayer ceramic electronic components (samples 3 to 6) according to an exemplary embodiment of the present disclosure.

In samples 1 to 6, high capacitance multilayer ceramic electronic component having a 1608 size (length×width× thickness: about 1.6 mm×0.8 mm×0.8 mm) were used, and measurement was performed under the same conditions except for a shape of the external electrode.

ESR of each of the samples was measured by mounting the multilayer ceramic electronic component on the board, connecting the ESR measuring device thereto, and confirming a change in ESR depending on a frequency, based on a numerical value when ESR was the lowest.

TABLE 1

| Sample | W1 | ESR(mΩ) | Judgment |
|---|---|---|---|
| 1 | Resin Electrode Layers Were Not Disposed on Base Electrode Layers | 7.74 | OK |
| 2 | Resin Electrode Layers Covered Entire Base Electrode Layers | 22.08 | NG |

TABLE 1-continued

| Sample | W1 | ESR(mΩ) | Judgment |
|---|---|---|---|
| 3 | 0.1 μm | 18.47 | NG |
| 4 | 1 μm | 7.39 | OK |
| 5 | 10 μm | 8.79 | OK |
| 6 | 100 μm | 7.35 | OK |

As illustrated in Table 1, it may be confirmed that in the case in which W1 is less than 1 μm (sample 3), an effect of decreasing ESR is not sufficient, and in the case in which W1 is 1 μm or more (samples 4 to 6), ESR is implemented at a level similar in sample 1 in which the resin electrode layers were not disposed on the base electrode layers.

As set forth above, according to exemplary embodiments of the present disclosure, the multilayer ceramic electronic component having low equivalent series resistance and excellent durability, a method of manufacturing the same, and a circuit board having the same may be provided.

In addition, according to exemplary embodiments of the present disclosure, the multilayer ceramic electronic component having excellent durability to bending force, a method of manufacturing the same, and a circuit board having the same may be provided.

While exemplary embodiments have been shown and described above, it will be apparent to those skilled in the art that modifications and variations could be made without departing from the scope of the present invention as defined by the appended claims.

What is claimed is:

1. A multilayer ceramic electronic component comprising:
a ceramic body including dielectric layers and internal electrodes interposed between the dielectric layers;
base electrode layers disposed on the ceramic body and including main portions connected to the internal electrodes and extension portions extending from the main portions, wherein each extension portion is disposed on a surface of the ceramic body having a main portion thereon;
resin electrode layers disposed on portions of surfaces of the base electrode layers; and
outer electrode layers disposed on the resin electrode layers and directly contacting the base electrode layers,
wherein a width of the extension portions is narrower than a width of a surface of the ceramic body on which the extension portion is disposed, the width of the surface of the ceramic body being measured in a direction parallel to a width direction of the extension portions.

2. The multilayer ceramic electronic component of claim 1, wherein the outer electrode layers are plating layers.

3. The multilayer ceramic electronic component of claim 2, wherein the plating layers cover end portions of the extension portions.

4. The multilayer ceramic electronic component of claim 1, wherein the width of each extension portion is measured in a direction perpendicular to a direction in which the extension portion extends from the main portion, such that the width direction of the extension portion is perpendicular to the direction in which the extension portion extends.

5. The multilayer ceramic electronic component of claim 1, wherein when the width of the extension portion is defined as W1 and the width of the surface of the ceramic body on which the extension portion is disposed, measured in the direction parallel to the width direction of the extension portion, is defined as W2, W1/W2 satisfies W1/W2≤0.5.

6. The multilayer ceramic electronic component of claim 1, wherein the width of the extension portion is 1 μm or more.

7. The multilayer ceramic electronic component of claim 1, wherein a length of a region of the extension portion on which the resin electrode layer is not formed is 1 μm or more.

8. The multilayer ceramic electronic component of claim 1, wherein each of the resin electrode layers covers a portion of a corresponding one of the extension portions.

9. The multilayer ceramic electronic component of claim 1, wherein each of the resin electrode layers covers an entirety of a corresponding one of the main portions.

10. The multilayer ceramic electronic component of claim 1, wherein the ceramic body has first and second surfaces opposing each other in a first direction, third and fourth surfaces opposing each other in a second direction, and fifth and sixth surfaces opposing each other in a third direction, and
the dielectric layers and the internal electrodes are stacked in the first direction, and the extension portions are disposed on the first and second surfaces of the ceramic body.

11. The multilayer ceramic electronic component of claim 1, wherein the ceramic body has first and second surfaces opposing each other in a first direction, third and fourth surfaces opposing each other in a second direction, and fifth and sixth surfaces opposing each other in a third direction, and
the dielectric layers and the internal electrodes are stacked in the first direction, and the extension portions are disposed on third and fourth surfaces of the ceramic body.

12. The multilayer ceramic electronic component of claim 1, wherein the ceramic body has first and second surfaces opposing each other in a first direction, third and fourth surfaces opposing each other in a second direction, and fifth and sixth surfaces opposing each other in a third direction, and
the dielectric layers and the internal electrodes are stacked in the first direction, and the extension portions are disposed on the first to fourth surfaces of the ceramic body.

13. The multilayer ceramic electronic component of claim 1, wherein the ceramic body has first and second surfaces opposing each other in a first direction, third and fourth surfaces opposing each other in a second direction, and fifth and sixth surfaces opposing each other in a third direction, and
the main portions and the resin electrode layers extend respectively from the fifth and sixth surfaces of the ceramic body to at least one of the first to fourth surfaces of the ceramic body.

14. The multilayer ceramic electronic component of claim 1, wherein the base electrode layers are sintered electrodes.

15. The multilayer ceramic electronic component of claim 1, wherein the resin electrode layers contain conductive particles and a thermosetting polymer.

16. A multilayer ceramic electronic component comprising:
a hexahedral shaped ceramic body having six outer surfaces and including dielectric layers and internal electrodes interposed between the dielectric layers; and
two external electrodes including base electrode layers disposed on two outer surfaces of the six outer surfaces of the ceramic body opposing each other and covering at least one of the four other outer surfaces of the ceramic body, the base electrode layers being connected to the internal electrodes, and the two external electrodes further including resin electrode layers disposed on the base electrode layers, wherein each of the resin electrode layers covers a portion of an edge of a corresponding one of the base electrode layers and extends onto at least one outer surface of the ceramic body.

17. The multilayer ceramic electronic component of claim 16, wherein the external electrodes further include plating layers disposed on the resin electrode layers, the plating layers contacting edges of the base electrode layers on which the resin electrode layers are not formed.

18. The multilayer ceramic electronic component of claim 16, wherein the two external electrodes cover entirety of the two outer surfaces of the ceramic body opposing each other.

19. The multilayer ceramic electronic component of claim 18, wherein each of the two external electrodes covers a portion of at least one of the four other outer surfaces of the hexahedral shaped ceramic body.

20. The multilayer ceramic electronic component of claim 19, wherein each of the base electrode layers includes a main portion connected to the internal electrodes and covering the portion of the at least one of the four other outer surfaces of the hexahedral shaped ceramic body, and an extension portion extending from the main portion, wherein the extension portion has a narrower width than that of the main portion.

21. A multilayer ceramic electronic component comprising:
a ceramic body including dielectric layers and internal electrodes interposed between the dielectric layers; and
external electrodes including base electrode layers disposed on the ceramic body and connected to the internal electrodes, resin electrode layers disposed on the base electrode layers, and plating layers disposed on the resin electrode layers,
wherein the base electrode layers include main portions, and equivalent series resistance (ESR) decreasing parts having end portions extending from the main portions, respectively, the end portions being provided on the area where the resin electrode layers are not formed such that the end portions of the ESR decreasing parts directly contact the plating layers.

22. The multilayer ceramic electronic component of claim 21, wherein the ESR decreasing parts cover a portion of one surface of the ceramic body on which the ESR decreasing parts are disposed in a direction perpendicular to a direction in which the ESR decreasing parts are extended.

23. The multilayer ceramic electronic component of claim 21, wherein the plating layers cover the end portions of the ESR decreasing parts.

24. The multilayer ceramic electronic component of claim 21, wherein when a width of the ESR decreasing part is defined as W1 and a width of the outer surface of the ceramic body on which the ESR decreasing part is disposed, measured in a direction perpendicular to a direction in which the ESR decreasing part is extended, is defined as W2, W1/W2 satisfies W1/W2≤0.5.

25. The multilayer ceramic electronic component of claim 21, wherein the width of the ESR decreasing part is 1 μm or more.

26. The multilayer ceramic electronic component of claim 21, wherein a length of the end portion of the ESR decreasing part is 1 μm or more, and the end portion is provided on the area where the resin electrode layer is not formed.

27. A method of manufacturing a multilayer ceramic electronic component, the method comprising;
forming a ceramic body including internal electrodes and dielectric layers;
forming base electrode layers on outer surfaces of the ceramic body and including main portions connected to the internal electrode layers and extension portions extending from the main portions, wherein each extension portion is disposed on an outer surface of the ceramic body having a main portion thereon;
forming resin electrode layers on portions of surfaces of the base electrode layers; and
forming outer electrode layers on the resin electrode layers such that the outer electrode layers directly contact the base electrode layers,
wherein the forming of the base electrode layers includes forming an extension portion having a width narrower than a width of an outer surface of the ceramic body on which the extension portion is disposed, the width of the outer surface being measured in a direction parallel to a width direction of the extension portion.

28. The method of claim 27, wherein the forming of the base electrode layers includes applying a main portion electrode paste and applying an extension portion electrode paste to be connected to the main portion electrode paste, and the applying of the main portion electrode paste is performed by dipping the ceramic body in the main portion electrode paste.

29. The method of claim 28, wherein the applying of the extension portion electrode paste is performed by printing the extension portion electrode paste on the ceramic body.

30. The method of claim 28, wherein a width of the extension portion is narrower than a width of a main portion disposed on a same outer surface as the extension portion, the width of the main portion being measured in a direction parallel to a width direction of the extension portion.

31. The method of claim 28, wherein the outer electrode layers are plating layers formed on the resin electrode layers to cover end portions of the extension portions.

32. The method of claim 28, wherein when the width of the extension portion is defined as W1 and the width of one surface of the ceramic body on which the extension portion is disposed, measured in a direction parallel to a width direction of the extension portion, is defined as W2, W1/W2 satisfies W1/W2≤0.5.

33. A circuit board having a multilayer ceramic electronic component comprising:
a printed circuit board on which electrode pads are disposed;
the multilayer ceramic electronic component of claim 1, mounted on the printed circuit board; and
solders connecting the electrode pads and the multilayer ceramic electronic component to each other, respectively.

34. A circuit board having a multilayer ceramic electronic component comprising:
a printed circuit board on which electrode pads are disposed;
the multilayer ceramic electronic component of claim 16, mounted on the printed circuit board; and
solders connecting the electrode pads and the multilayer ceramic electronic component to each other, respectively.

35. A circuit board having a multilayer ceramic electronic component comprising:
a printed circuit board on which electrode pads are disposed;

the multilayer ceramic electronic component of claim 21, mounted on the printed circuit board; and solders connecting the electrode pads and the multilayer ceramic electronic component to each other, respectively.

36. The multilayer ceramic electronic component of claim 1, wherein:

the internal electrodes extend to opposing first and second surfaces of the ceramic body, the base electrode layers include first and second base electrode layers that include respective main portions disposed on the first and second surfaces, respectively, and connected to the internal electrodes on the first and second surfaces, respectively, and extension portions of the first and second base electrode layers extend from the main portions on surfaces of the ceramic body other than the first and second surfaces.

37. The multilayer ceramic electronic component of claim 1, wherein the base electrode layers each include a plurality of extension portions extending from the main portions on multiple different surfaces of the ceramic body.

38. The multilayer ceramic electronic component of claim 1, wherein the resin electrode layers extend to contact the ceramic body.

39. The multilayer ceramic electronic component of claim 1, wherein the extension portions are disposed in non-rectangular patterns on the ceramic body.

40. The multilayer ceramic electronic component of claim 1, wherein the outer electrode layers cover an entirety of the base electrode layers and resin electrode layers.

41. The method of claim 27, wherein the forming outer electrode layers comprises forming the outer electrode layers such that the outer electrode layers cover an entirety of the base electrode layers and resin electrode layers.

* * * * *